(12) United States Patent
Kim et al.

(10) Patent No.: US 8,420,296 B2
(45) Date of Patent: Apr. 16, 2013

(54) PHOTORESIST COMPOSITION FOR COLOR FILTER PROTECTIVE LAYER, COLOR FILTER PROTECTIVE LAYER INCLUDING THE SAME, AND IMAGE SENSOR INCLUDING THE SAME

(75) Inventors: Jae-Hyun Kim, Uiwang-si (KR);
Se-Young Choi, Uiwang-si (KR);
Nam-Gwang Kim, Uiwang-si (KR);
Eui-June Jeong, Uiwang-si (KR);
Chang-Min Lee, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 124 days.

(21) Appl. No.: 12/868,975

(22) Filed: Aug. 26, 2010

(65) Prior Publication Data

US 2011/0160329 A1 Jun. 30, 2011

(30) Foreign Application Priority Data

Dec. 28, 2009 (KR) ........................ 10-2009-0132216

(51) Int. Cl.
*G03C 1/00* (2006.01)
*G03C 7/00* (2006.01)
*C08F 2/50* (2006.01)
*C08J 3/28* (2006.01)

(52) U.S. Cl.
USPC .................. 430/287.1; 430/270.1; 430/280.1; 430/281.1; 430/286.1; 430/288.1; 430/293; 430/292; 430/300; 430/301; 430/303; 430/306; 430/338; 522/168; 522/166; 522/162; 522/170; 522/154; 522/153; 522/144; 522/135; 522/111; 522/109; 522/103; 522/101; 522/100

(58) Field of Classification Search .................. 522/100, 522/101, 103, 109, 111, 134, 135, 144, 149, 522/153, 154, 162, 166, 168, 170; 430/270.1, 430/280.1, 281.1, 286.1, 287.1, 288.1, 293, 430/292, 300, 301, 303, 306, 338
See application file for complete search history.

(56) References Cited

U.S. PATENT DOCUMENTS

| | | | |
|---|---|---|---|
| 4,943,516 A * | 7/1990 | Kamayachi et al. | 430/280.1 |
| 5,049,628 A * | 9/1991 | Nawata et al. | 525/502 |
| 5,631,111 A * | 5/1997 | Niu et al. | 430/7 |
| 6,399,277 B1 * | 6/2002 | Nojima et al. | 430/280.1 |
| 7,851,789 B2 | 12/2010 | Lee et al. | |
| 2008/0051483 A1 | 2/2008 | Cho et al. | |

FOREIGN PATENT DOCUMENTS

| | | |
|---|---|---|
| CN | 1455889 | 11/2003 |
| JP | 2002-0406553 | 2/2002 |
| JP | 2008-083228 A | 4/2008 |
| JP | 2009-020462 | 1/2009 |
| KR | 10-2008-0003764 A | 1/2008 |
| KR | 10-2008-0018615 A | 2/2008 |
| KR | 10-2009-0059965 A | 6/2009 |

\* cited by examiner

*Primary Examiner* — Sanza McClendon
(74) *Attorney, Agent, or Firm* — Summa, Additon & Ashe, P.A.

(57) ABSTRACT

Disclosed is a photosensitive resin composition for a color filter protective layer including a cross-linkable alkali soluble resin including a repeating unit represented by the following Chemical Formula 1, a reactive unsaturated compound, a photopolymerization initiator, and a solvent.

[Chemical Formula 1]

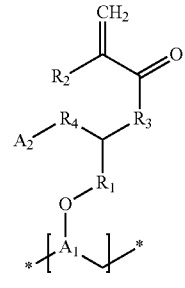

[Chemical Formula 2]

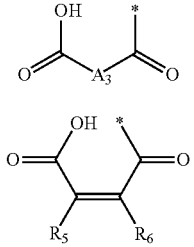

[Chemical Formula 3]

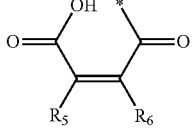

In Chemical Formulae 1 to 3, R1 to R6 and A1 to A3 are the same as in the detailed description.

9 Claims, 1 Drawing Sheet

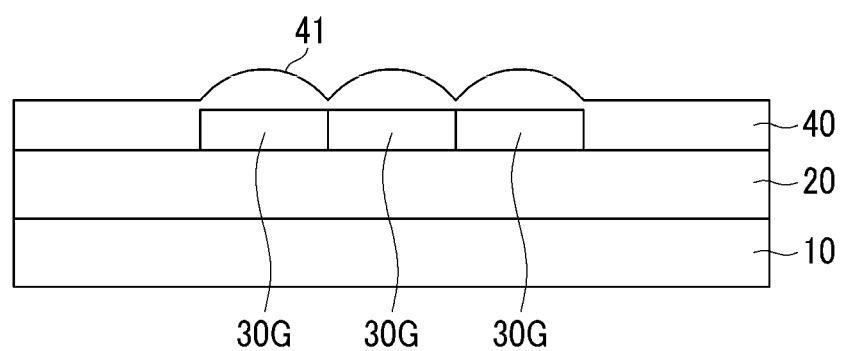

PHOTORESIST COMPOSITION FOR COLOR FILTER PROTECTIVE LAYER, COLOR FILTER PROTECTIVE LAYER INCLUDING THE SAME, AND IMAGE SENSOR INCLUDING THE SAME

CROSS-REFERENCE TO RELATED APPLICATION

This application claims priority to and the benefit of Korean Patent Application No. 10-2009-0132216 filed in the Korean Intellectual Property Office on Dec. 28, 2009, the entire disclosure of which is incorporated herein by reference.

FIELD OF THE INVENTION

The present invention relates to a photosensitive resin composition for a color filter protective layer, a color filter protective layer manufactured using the same, and an image sensor including the color filter protective layer.

BACKGROUND OF THE INVENTION

An image sensor is a device including several million photoelectric conversion devices for converting light into an electric signal, based on the intensity of light received by the device. The image sensor can be used in a digital input device which digitalizes recorded images. This technology is rapidly developing, and there is increasing demand for devices in various applications such as security devices and digital porters.

Image sensors include a pixel array in which a plurality of pixels is arranged in a matrix form. Each pixel includes a photo-sensing device and a transmitting and signal output device. Image sensors are broadly categorized as charge-coupled device (CCD) image sensors and complementary metal oxide semiconductor (CMOS) image sensors, depending upon the transmitting and signal output device therein. CMOS image sensors concentrate external light through microlenses, and the concentrated light is transmitted to a photo-sensing device such as a photodiode that outputs a signal.

CMOS image sensors can be further modified to increase resolution. Recent research has focused on decreasing pixel size down to 1 μm or less. Because a small pixel size of 1 μm or less receives 1.5 times the visible ray wave length, its geometric and wave optical aspects in relation to the microlenses have to be considered. Further, as the unit pixel becomes smaller, the diameter of each microlens becomes smaller. Accordingly, unless the lenses have a shorter focal distance, a crosstalk phenomenon between adjacent pixels more easily occurs, which can deteriorate resolution.

In order to solve this problem, the thickness of each layer disposed between the photodiode and the microlens can be reduced. Conventional layers have included a thermally-curable resin composition, such as a resin composition including a self-curable copolymer and an epoxy compound.

SUMMARY OF THE INVENTION

An exemplary embodiment of the present invention provides a photosensitive resin composition for a color filter protective layer that can have an excellent close contacting (adhesive) property with a lower layer and also can have an excellent pattern profile.

Another embodiment of the present invention provides a color filter protective layer prepared using the photosensitive resin composition for a color filter protective layer.

Yet another embodiment of the present invention provides an image sensor including the color filter protective layer.

According to one embodiment of the present invention, provided is a photosensitive resin composition for a color filter protective layer including: (A) an alkali soluble resin including a cross-linkable alkali soluble resin including a repeating unit represented by the following Chemical Formula 1; (B) a reactive unsaturated compound; (C) a photopolymerization initiator; and (D) a solvent.

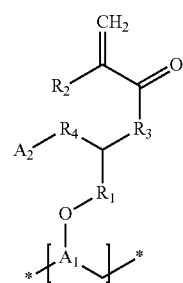

[Chemical Formula 1]

In Chemical Formula 1,

A1 is a substituted or unsubstituted aromatic organic group or a substituted or unsubstituted alicyclic organic group, A2 is represented by the following Chemical Formula 2 or 3, R1 and R3 are independently substituted or unsubstituted alkylene, R2 is hydrogen or substituted or unsubstituted alkyl, and R4 is an oxygen atom or substituted or unsubstituted amine.

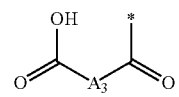

[Chemical Formula 2]

In Chemical Formula 2,

A3 is a substituted or unsubstituted aromatic organic group or a substituted or unsubstituted alicyclic organic group.

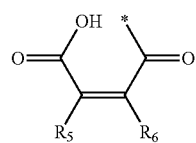

[Chemical Formula 3]

In Chemical Formula 3,

R5 and R6 are independently hydrogen, halogen, or substituted or unsubstituted alkyl.

The cross-linkable alkali soluble resin including a repeating unit represented by Chemical Formula 1 of the (A) alkali soluble resin may have a weight average molecular weight (MW) ranging from 1000 to 50,000.

The photosensitive resin composition for a color filter protective layer may include: 0.1 to 30 wt % of the alkali soluble resin (A); 0.1 to 30 wt % of the reactive unsaturated compound (B); 0.05 to 10 wt % of the photopolymerization initiator (C); and balance of the solvent (D).

The photosensitive resin composition for a color filter protective layer may further include (E) an additive selected from the group consisting of a silane coupling agent, a surfactant, and a combination thereof.

According to another embodiment of the present invention, provided is a color filter protective layer fabricated using the color filter protective layer composition according to one embodiment of the present invention.

According to still another embodiment of the present invention, provided is an image sensor including the color filter protective layer as an overcoat or an overcoat simultaneously used as microlenses.

The photosensitive resin composition for a color filter protective layer of the invention may have an excellent close contacting (adhesive) property with a lower layer and an excellent pattern profile.

BRIEF DESCRIPTION OF THE DRAWING

FIG. 1 is a schematic diagram showing an image sensor according to an embodiment of the present invention.

DETAILED DESCRIPTION

The present invention now will be described more fully hereinafter in the following detailed description of the invention and with reference to the accompanying drawing, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a definition is not otherwise provided, the term "substituted" may refer to one substituted with a substituent comprising halogen (F, Br, Cl, or I), hydroxy, nitro, cyano, amino (—NRR', wherein R and R' are independently C1 to C10 alkyl), amidino, hydrazine, hydrazone, carboxyl, substituted or unsubstituted alkyl, substituted or unsubstituted aryl, substituted or unsubstituted cycloalkyl, substituted or unsubstituted heteroalkyl, substituted or unsubstituted heteroaryl, or substituted or unsubstituted heterocycloalkyl in place of hydrogen, one substituted with a substituent comprising =O, =S, =NR (wherein R is C1 to C10 alkyl), =PR (wherein R is C1 to C10 alkyl), and =CRR' (wherein R and R' are independently C1 to C10 alkyl) in place of two hydrogens, and one substituted with a substituent comprising ≡N, ≡P, and ≡CR (wherein R is C1 to C10 alkyl) in place of three hydrogens.

As used herein, when a definition is not otherwise provided, the term "alkyl" may refer to C1 to C30 alkyl, the term "aryl" may refer to C6 to C30 aryl, the term "cycloalkyl" may refer to C3 to C30 cycloalkyl, the term "alkylene" may refer to C1 to C30 alkylene, and the term "arylene" may refer to C6 to C30 arylene.

In addition, unless a definition is otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, the term "alicyclic organic group" may refer to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, and the term "aromatic organic group" may refer to C6 to C30 aryl, C2 to C30 heteroaryl, C6 to C30 arylene, or C2 to C30 heteroarylene.

As used herein, when a definition is not otherwise provided, the term "hetero" may refer to one or more heteroatoms selected from N, O, S, P, Si, and combinations thereof.

In this specification, the term "combination" may refer to a mixture or a copolymer unless defined otherwise.

In addition, the symbol "★" of the chemical formulae set forth in this specification refers to a place connected to the same or different atoms or connected to a chemical formula.

The drawings are not necessarily drawn to scale, and the thickness of layers, films, panels, regions, etc., accordingly may be exaggerated for clarity.

According to one embodiment of the present invention, the photosensitive resin composition for a color filter protective layer includes: (A) an alkali soluble resin including a crosslinkable alkali soluble resin including a repeating unit represented by the following Chemical Formula 1; (B) a reactive unsaturated compound; (C) a photopolymerization initiator; and (D) a solvent.

[Chemical Formula 1]

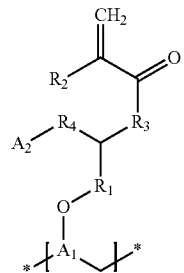

In Chemical Formula 1,

A1 is a substituted or unsubstituted aromatic organic group or a substituted or unsubstituted alicyclic organic group, A2 is represented by the following Chemical Formula 2 or 3, R1 and R3 are independently substituted or unsubstituted alkylene, R2 is hydrogen or substituted or unsubstituted alkyl, and R4 is an oxygen atom or substituted or unsubstituted amine.

[Chemical Formula 2]

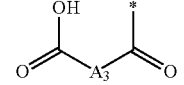

In Chemical Formula 2,

A3 is a substituted or unsubstituted aromatic organic group or a substituted or unsubstituted alicyclic organic group.

[Chemical Formula 3]

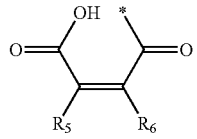

In Chemical Formula 3,

R5 and R6 are independently hydrogen, halogen, or substituted or unsubstituted alkyl.

In addition, the photosensitive resin composition for a color filter protective layer may include (E) an additive such as a silane coupling agent, a surfactant, and the like.

Hereinafter, each component will be illustrated in more detail.

(A) Alkali Soluble Resin

The photosensitive resin composition for a color filter protective layer may include a cross-linkable alkali soluble resin having a repeating unit represented by the following Chemical Formula 1.

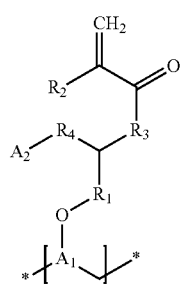

[Chemical Formula 1]

In Chemical Formula 1,

A1 is a substituted or unsubstituted aromatic organic group or a substituted or unsubstituted alicyclic organic group, for example, aryl substituted with alkyl, A2 is represented by the following Chemical Formula 2 or 3, R1 and R3 are independently substituted or unsubstituted alkylene, R2 is hydrogen or substituted or unsubstituted alkyl, for example, methyl, and, R4 is an oxygen atom or substituted or unsubstituted amine, for example, amine substituted with alkyl.

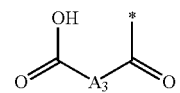

[Chemical Formula 2]

In Chemical Formula 2,

A3 may be a substituted or unsubstituted aromatic organic group or a substituted or unsubstituted alicyclic organic group, for example, aryl substituted with alkyl or carboxyl and the like.

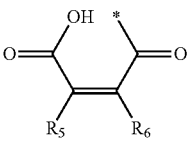

[Chemical Formula 3]

In Chemical Formula 3,

R5 and R6 are independently hydrogen, halogen, or substituted or unsubstituted alkyl, for example, methyl and the like.

The cross-linkable alkali soluble resin may have a weight average molecular weight ranging from 1000 to 50,000 or from 5000 to 35,000 in another embodiment. When the cross-linkable alkali soluble resin has a weight average molecular weight within these ranges, it may dissolve in a solvent, may be easily coated and can have excellent flatness in a color filter protective layer.

The photosensitive resin composition for a color filter protective layer may include at least one or more kinds of the cross-linkable alkali soluble resin including a repeating unit represented by Chemical Formula 1, and optionally may further include one or more kinds of alkali soluble resin that is different from the cross-linkable alkali soluble resin including a repeating unit represented by Chemical Formula 1.

The latter alkali soluble resin (i.e., an alkali soluble resin that is different from the cross-linkable alkali soluble resin including a repeating unit represented by Chemical Formula 1) may include a copolymer of a first ethylenic unsaturated monomer and another second ethylenic unsaturated monomer that can be copolymerized with the first ethylenic unsaturated monomer.

The first ethylenic unsaturated monomer may include an ethylenic unsaturated monomer including more than one carboxyl group. Exemplary first ethylenic unsaturated monomers including more than one carboxyl group include without limitation acrylic acid, methacrylic acid, maleic acid, itaconic acid, fumaric acid, and the like, and combinations thereof.

The alkali soluble resin that is different from the cross-linkable alkali soluble resin including a repeating unit represented by Chemical Formula 1 may include the first ethylenic unsaturated monomer in a weight ratio of 10% to 40%, based on the total weight of the copolymer.

Examples of the second ethylenic unsaturated monomer that can be copolymerized with the first ethylenic unsaturated monomer may include without limitation an alkenyl aromatic monomer, an unsaturated carbonic acid ester-based compound, an unsaturated carbonic acid amino alkyl ester-based compound, a carbonic acid vinyl ester-based compound, an unsaturated carbonic acid glycidyl ester-based compound, a vinyl cyanide compound, an unsaturated amide-based compound, and the like, and combinations thereof.

Examples of the alkenyl aromatic monomer may include without limitation styrene, α-methyl styrene, vinyl toluene, vinyl benzylmethylether, and the like, and combinations thereof. Examples of the unsaturated carbonic acid ester-based compound may include without limitation methyl acrylate, methyl methacrylate, ethyl acrylate, ethyl methacrylate, butyl acrylate, butyl methacrylate, 2-hydroxy ethyl acrylate, 2-hydroxy ethyl methacrylate, 2-hydroxy butyl acrylate, 2-hydroxy butyl methacrylate, benzyl acrylate, benzyl methacrylate, cyclohexyl acrylate, cyclohexyl methacrylate, phenyl acrylate, phenyl methacrylate, and the like, and combinations thereof. Examples of the unsaturated carbonic acid amino alkyl ester-based compound may include without limitation 2-amino ethyl acrylate, 2-amino ethyl methacrylate, 2-dimethyl amino ethyl acrylate, 2-dimethyl amino ethyl methacrylate, and the like, and combinations thereof. Examples of the carbonic acid vinyl ester-based compound may include without limitation vinyl acetate, vinyl benzoate, and the like, and combinations thereof. Examples of the unsaturated carbonic acid glycidyl ester-based compound may include without limitation glycidyl acrylate, glycidyl methacrylate, and the like, and combinations thereof. Examples of the vinyl cyanide compound may include without limitation acrylonitrile, methacrylonitrile, and the like, and combinations thereof. Examples of the unsaturated amide-based compound may include without limitation acryl amide, methacryl amide, and the like, and combinations thereof. These unsaturated monomers may be respectively used singularly or in a mixture of two or more.

The photosensitive resin composition for a color filter protective layer may include the cross-linkable alkali soluble resin having a repeating unit represented by Chemical Formula 1 in an amount ranging from 0.1 to 30 wt %, for example from 0.5 to 20 wt %, based on the total weight of the photosensitive resin composition for a color filter protective layer. The cross-linkable alkali soluble resin with repeat units of Chemical Formula 1 and any other alkali soluble resin when present in the composition may be used at a weight ratio of 1:0.5 to 20.

In some embodiments, the alkali soluble resin may be used in an amount of 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the alkali soluble resin can be in a range from any of the foregoing amounts to any other of the foregoing amounts.

When the alkali soluble resin is included in an amount within these ranges, the prepared color filter protective layer may have an excellent close contacting property with a lower layer and also an excellent pattern profile and flatness during the coating.

(B) Reactive Unsaturated Compound

The reactive unsaturated compound can be any monomer or oligomer generally used in a photosensitive resin composition. In exemplary embodiments of the invention, the reactive unsaturated compound may be a mono-functional or multi-functional ester of acrylic acid or methacrylic acid having at least one ethylenic unsaturated double bond. Examples of the reactive unsaturated compound may include without limitation ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, dipentaerythritol hexaacrylate, bisphenol A diacrylate, trimethylol propane triacrylate, novolacepoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like, and combinations thereof.

Commercially available examples of the mono-functional (meth)acrylic acid ester may include without limitation Aronix M-101®, M-111®, M-114® (To a Gosei Kagaku Kogyo Co. Ltd.), KAYARAD TC-110S®, TC-120S® (Nihon Kayaku Co. Ltd.), V-158®, V-2311® (Osaka Yuki Kagaku Kogyo Co. Ltd.), and the like. Examples of a bi-functional (meth)acrylic acid ester may include without limitation Aronix M-210®, M-240®, M-6200® (To a Gosei Kagaku Kogyo Co. Ltd.), KAYARAD HDDA®, HX-220®, R-604® (Nihon Kayaku Co. Ltd.), V-260®, V-312®, V-335 HP® (Osaka Yuki Kagaku Kogyo Co. Ltd.), and the like. Examples of a tri-functional (meth)acrylic acid ester may include without limitation Aronix M-309®, M-400®, M-405®, M-450®, M-7100®, M-8030®, M-8060® (To a Gosei Kagaku Kogyo Co. Ltd.), KAYARAD TMPTA®, DPCA-20®, DPCA-30®, DPCA-60®, DPCA-120® (Nihon Kayaku Co. Ltd.), V-295®, V-300®, V-360®, V-GPT®, V-3PA®, V-400® (Osaka Yuki Kayaku Kogyo Co. Ltd.), and the like. The reactive unsaturated compounds may be used singularly or as a mixture of two or more.

The photosensitive resin composition for a color filter protective layer may include the reactive unsaturated compound in an amount ranging from 0.1 to 30 wt %, for example 0.5 to 20 wt %, based on the total weight of the photosensitive resin composition for a color filter protective layer. In some embodiments, the reactive unsaturated compound may be used in an amount of 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the reactive unsaturated compound can be in a range from any of the foregoing amounts to any other of the foregoing amounts.

When the reactive unsaturated compound is included in an amount within these ranges, the composition may have excellent sensitivity under oxygen, excellent pattern formation, and excellent chemical and heat resistance, and also improved compatibility with a resin, which can provide a smooth surface of a coating layer.

(C) Photopolymerization Initiator

The photopolymerization initiator may be any common photopolymerization initiator generally used for a photosensitive resin composition. Examples of the photopolymerization initiator include without limitation triazine-based compounds, acetophenone-based compounds, benzophenone-based compounds, thioxanthone-based compounds, benzoin-based compounds, and the like, and combinations thereof.

Examples of the triazine-based compound may include without limitation 2,4,6-trichloro-s-triazine, 2-phenyl-4,6-bis(trichloro methyl)-s-triazine, 2-(3',4'-dimethoxy styryl)-4,6-bis(trichloro methyl)-s-triazine, 2-(4'-methoxy naphthyl)-4,6-bis(trichloro methyl)s-triazine, 2-(p-methoxy phenyl)-4,6-bis(trichloro methyl)-s-triazine, 2-(p-tolyl)-4,6-bis (trichloro methyl)-s-triazine, 2-biphenyl-4,6-bis(trichloro methyl)-s-triazine, bis(trichloro methyl)-6-styryl-s-triazine, 2-(napto 1-yl)-4,6-bis(trichloro methyl)-s-triazine, 2-(4-methoxy napto 1-yl)-4,6-bis(trichloro methyl)-s-triazine, 2-4-trichloro methyl(piperonyl)-6-triazine, 2-4-trichloro methyl (4'-methoxy styryl)-6-triazine, and the like, and combinations thereof.

Examples of the acetophenone-based compound may include without limitation 2,2'-diethoxy acetophenone, 2,2'-dibutoxy acetophenone, 2-hydroxy-2-methylpropiophenone, p-t-butyltrichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholinopropane-1-one, 2-benzyl-2-dimethylamino-1-(4-morpholinophenyl)-butane-1-one, and the like, and combinations thereof.

Examples of the benzophenone-based compound may include without limitation benzophenone, benzoyl benzoate, methyl benzoyl benzoate, 4-phenyl benzophenone, hydroxy benzophenone, acrylated benzophenone, 3,3'-dimethyl-2-methoxy benzophenone, 4,4'-dichloro benzophenone, 4,4'-bis(dimethylamino) benzophenone, 4,4'-bis(diethylamino) benzophenone, and the like, and combinations thereof.

Examples of the thioxanthone-based compound may include without limitation thioxanthone, 2-methyl thioxanthone, isopropyl thioxanthone, 2,4-diethyl thioxanthone, 2,4-diisopropyl thioxanthone, 2-chloro thioxanthone, and the like, and combinations thereof.

Examples of the benzoin-based compounds may include without limitation benzoin, benzoin methylether, benzoin ethylether, benzoin isopropylether, benzoin isobutylether, benzyldimethylketal, and the like, and combinations thereof.

Other examples of the photopolymerization initiator may include without limitation carbazole-based compounds, diketone-based compounds, sulfonium borate-based compounds, diazo-based compounds, nonimidazole-based compounds, and the like, and combinations thereof, in addition to the aforementioned compounds.

The photopolymerization initiator absorbs light and thereby becomes excited and delivers energy. Accordingly, it can be used together with a photo sensitizer causing a chemical reaction.

The photosensitive resin composition for a color filter protective layer may include the photopolymerization initiator in an amount ranging from 0.05 to 10 wt %, based on the total weight of the photosensitive resin composition for a color filter protective layer. In some embodiments, the photopolymerization initiator may be used in an amount of 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from any of the foregoing amounts to any other of the foregoing amounts.

When the photopolymerization initiator is included in an amount within this range, it may bring about good radical sensitivity and excellent pattern formation, appropriately maintain color concentration of a solution, and can prevent extraction when stored at a low temperature and transmittance deterioration due to the non-reacted initiator.

(D) Solvent

The solvent is compatible with the alkali soluble resin, and other component materials of the composition of the invention, but does react therewith.

Examples of the solvent may include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butyl ketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; hydroxyl acetic acid alkyl esters such as oxy methyl acetate, oxy ethyl acetate, oxy butyl acetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkylesters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; monooxy monocarboxylic acid alkyl esters of 2-oxy-2-methyl propionic acid esters such as 2-oxy-2-methyl methyl propionate, ethyl 2-hydroxyl-2-methyl propionate, and the like; 2-alkoxy-2-methyl propionic acid alkyls such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; and ketone acid esters such as ethyl pyruvate, and the like; and combinations thereof. In addition, the solvent may include a solvent with a high boiling point such as N-methylformamide, N,N-dimethyl formamide, N-methylformanylide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzyl alcohol, benzyl acetate, ethyl benzoate, diethyl oxalate, diethyl malate, γ-butyrolactone, carbonate ethylene, carbonate propylene, phenyl cellosolve acetate, and the like, and combinations thereof.

In exemplary embodiments, taking into account compatibility and reactivity, the solvent may include glycol ethers such as ethylene glycol monoethyl ether and the like; cellosolve acetates such as ethyl cellosolve acetate, and the like; esters such as 2-hydroxy ethyl propionate and the like; diethylene glycol such as diethylene glycol monomethyl ether and the like; and propylene glycol alkylether acetates such as propylene glycol methylether acetate, propylene glycol propylether acetate, and the like.

The solvent may be included as a balance amount after adding other components, or in an amount ranging from 30 to 95 wt % based on the entire weight of the photosensitive resin composition for a color filter protective layer in another embodiment. In some embodiments, the solvent may be used in an amount of 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, or 95 wt %. Further, according to some embodiments of the present invention, the amount of the solvent can be in a range from any of the foregoing amounts to any other of the foregoing amounts.

When the solvent is added in an amount within these ranges, the prepared composition may have appropriate viscosity, so that the thickness of a color filter protective layer can be properly controlled.

(E) Other Additives

The photosensitive resin composition for a color filter protective layer may further include a silane coupling agent having a reactive substituent, such as but not limited to a carboxyl group, a methacryloyl group, an isocyanate group, an epoxy group, or a combination thereof, in order to improve adherence to a substrate.

Examples of the silane coupling agent may include without limitation trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl) ethyltrimethoxysilane, and the like, and may be used singularly or in a mixture of two or more.

The photosensitive resin composition for a color filter protective layer may include the silane coupling agent in an amount ranging from 0 to 20 parts by weight, based on 100 parts by weight of the alkali soluble resin.

In addition, the photosensitive resin composition for a color filter protective layer may further include a surfactant to improve coating and to prevent a defective product. Exemplary surfactants include without limitation fluorine-based surfactants, silicon-based surfactants, and the like, and combinations thereof.

Exemplary fluorine-based surfactants include without limitation BM-1000®, and BM-1100® made by BM Chemie Inc.; MEGAFACE F 142D®, F 172®, F 173®, and F 183® made by DaiNippon Ink Kagaku Kogyo Co. ltd.; FULORAD FC-135®, FULORAD FC-170C®, FULORAD FC-430®, and FULORAD FC-431® made by Sumitomo 3M Co. Ltd.; SURFLON S-112®, SURFLON S-113®, SURFLON S-131®, SURFLON S-141®, and SURFLON S-145® made by Asahi Glass Co. Ltd.; and SH-28PA®, SH-190®, SH-193®, SZ-6032®, and SF-8428®, and the like made by Toray Silicone Co. Ltd.

The photosensitive resin composition for a color filter protective layer may include the surfactant in an amount ranging from 0.001 to 5 parts by weight, based on 100 parts by weight of the alkali soluble resin. When surfactant is included in an amount within the above range, it may promote coating uniformity with no stain and impart a good wetting property for a glass substrate.

According to another embodiment of the present invention, the photosensitive resin composition for a color filter protective layer is used to prepare a color filter protective layer.

The color filter protective layer may be prepared using any conventional method known in the art. For example, the photosensitive resin composition for a color filter protective layer may be coated on a substrate and then cured. Exemplary coating techniques can include without limitation spin coating, printing, spray coating, roll coating, and the like. The curing may be performed using an oven and the like.

According to another embodiment of the present invention, provided is an image sensor including the color filter protective layer as an overcoat or an overcoat simultaneously used as microlens.

FIG. 1 is a diagram schematically showing an image sensor including the color filter protective layer according to another embodiment of the present invention as an overcoat used as microlens.

Referring to FIG. 1, an image sensor includes a substrate 10, a thin film device structure 20 on the substrate 10, red, green, and blue color filters 30R, 30G, and 30B sequentially formed on the surface of the thin film device structure 20, and a color filter protective layer formed using a photosensitive resin composition for a color filter protective layer according to one embodiment of the present invention thereon, which is patterned to function simultaneously as an overcoat 40 and microlenses 41. The microlenses 41 may have an influence on the resolution of an image sensor. In addition, since its surface characteristic may not be deteriorated during the etching, it may have improved surface roughness even after the etching.

Hereinafter, the embodiments are illustrated in more detail with reference to examples. However, the following are exemplary embodiments and are not limiting.

Synthesis of a Cross-Linkable Alkali Soluble Resin

SYNTHESIS EXAMPLE 1

45 g of PL-OCNE5P (a novolac epoxy resin) made by Nippon Kayaku Co., Ltd., 31 g of acrylic acid made by Daejung Chemicals & Metals Co., Ltd., 0.23 g of triphenylphosphine made by Aldrich Co., 0.23 g of benzyltriethyl ammonium chloride made by Daejung Chemicals & Metals Co., Ltd., and 200 g of propylene glycol methyletheracetate (PGMEA) made by Aldrich Co. are put in a reactor. The mixture is agitated and heated to 80° C. and maintained at the same temperature for 5 hours. Next, 23 g of tetrahydrophthalic anhydride made by Aldrich Co. is added to the resulting product and heated to 110° C. and then maintained at the same temperature for 2 hours, synthesizing a cross-linkable alkali soluble resin (hereinafter referred to as "polymer 1"). The synthesis processes are illustrated in the following Reaction Schemes 1 and 2.

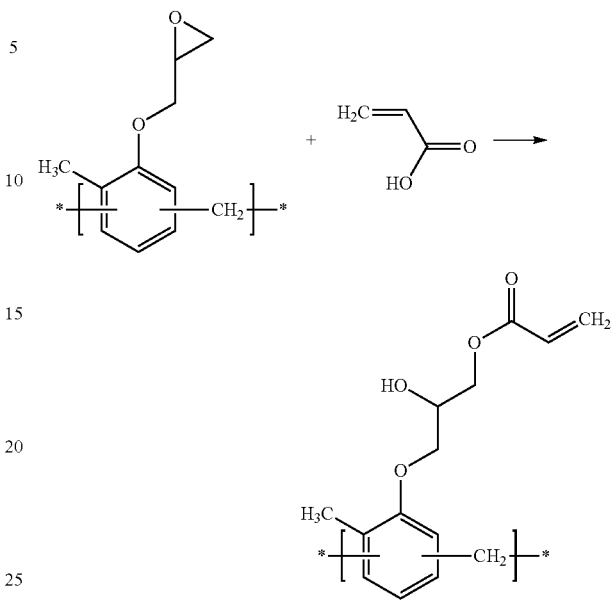

[Reaction Scheme 1]

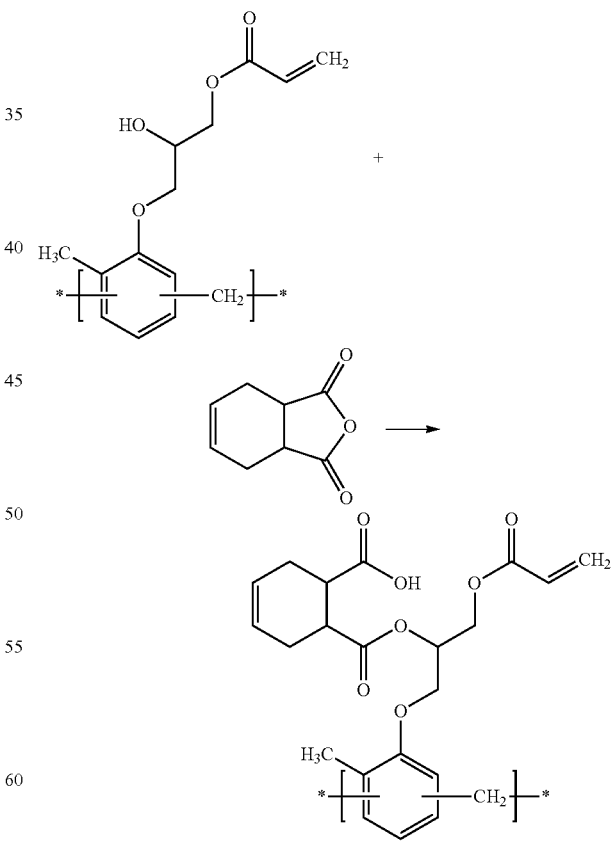

[Reaction Scheme 2]

The polymer 1 has a weight average molecular weight (Mw) of 12,000.

Molecular Weight Measurement

The weight average molecular weight of the polymer is measured using GPC (Alliance 2695 model) made by Waters Co.

SYNTHESIS EXAMPLE 2

A polymer 2 having a weight average molecular weight of 16,000 is synthesized according to the same method as Synthesis Example 1, except for using tetrahydrophthalic anhydride in an amount of 40 g instead of 23 g.

SYNTHESIS EXAMPLE 3

A polymer 3 having a weight average molecular weight of 13,000 is synthesized according to the same method as Synthesis Example 1, except for using 23 g of a compound represented by the following Chemical Formula 4 instead of 23 g of tetrahydrophthalic anhydride.

[Chemical Formula 4]

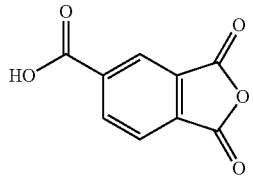

SYNTHESIS EXAMPLE 4

A polymer 4 having a weight average molecular weight of 16,000 is synthesized according to the same method as Synthesis Example 1, except for using 40 g of a compound represented by the following Chemical Formula 4 instead of 23 g of tetrahydrophthalic anhydride.

SYNTHESIS EXAMPLE 5

A polymer 5 having a weight average molecular weight of 12,000 is synthesized according to the same method as Synthesis Example 1, except for using 23 g of a compound represented by the following Chemical Formula 5 instead of 23 g of tetrahydrophthalic anhydride.

[Chemical Formula 5]

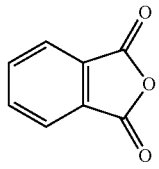

SYNTHESIS EXAMPLE 6

A polymer 6 having a weight average molecular weight of 15,000 is synthesized according to the same method as Synthesis Example 1, except for using 40 g of a compound represented by the following Chemical Formula 5 instead of 23 g of tetrahydrophthalic anhydride.

SYNTHESIS EXAMPLE 7

A polymer 7 having a weight average molecular weight of 12,000 is synthesized according to the same method as Synthesis Example 1, except for using 23 g of a compound represented by the following Chemical Formula 6 instead of 23 g of tetrahydrophthalic anhydride.

[Chemical Formula 6]

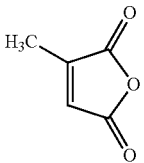

SYNTHESIS EXAMPLE 8

A polymer 8 having a weight average molecular weight of 14,000 is synthesized according to the same method as Synthesis Example 1, except for using 40 g of a compound represented by the following Chemical Formula 6 instead of 23 g of tetrahydrophthalic anhydride.

SYNTHESIS EXAMPLE 9

A polymer 9 having a weight average molecular weight of 12,000 is synthesized according to the same method as Synthesis Example 1, except for using 23 g of a compound represented by the following Chemical Formula 7 instead of 23 g of tetrahydrophthalic anhydride.

[Chemical Formula 7]

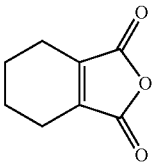

SYNTHESIS EXAMPLE 10

A polymer 10 having a weight average molecular weight of 16,000 is synthesized according to the same method as Synthesis Example 1, except for using 40 g of a compound represented by the following Chemical Formula 7 instead of 23 g of tetrahydrophthalic anhydride.

COMPARATIVE SYNTHESIS EXAMPLE 1

A nitrogen atmosphere is created in a flask having an agitator, a refluxing cooler, a drying pipe, a nitrogen-introducing pipe, a thermometer, and a circulator with a temperature controller by substituting nitrogen for air. Then, 15 g of methacrylic acid, 10 g of styrene made by Aldrich Co., 75 g of dicyclopentanyl methacrylate made by Aldrich Co., 10 g of 2,2'-azobis(2,4-dimethyl valeronitrile) made by Aldrich Co., and 208 g of PGMEA are put in the flask. While the flask is dipped in an oil bath, the mixture is agitated at 70° C. and polymerized for 3 hours to synthesize an alkali soluble resin (hereinafter referred to as "polymer 11"). The polymer 11 has a weight average molecular weight of 20,000.

Preparation of a Photosensitive Resin Composition for a Color Filter Protective Layer

PREPARATION EXAMPLE 1

1.5 g of the polymer 1, 15.0 g of the polymer 11, 16.5 g of dipentaerythritol hexaacrylate, IGR 369® 4.0 g made by Ciba Geigy Ltd., 62.2 g of PGMEA, and 0.7 g of S-510® (γ-glycidoxypropyl trimethoxysilane) made by Chisso Co. are mixed and then agitated together, preparing a photosensitive resin composition for a color filter protective layer.

PREPARATION EXAMPLES 2 to 10

Photosensitive resin compositions for a color filter protective layer according to Preparation Examples 2 to 10 are prepared according to the same method as Example 1, except for respectively using the polymers 2 to 10 instead of the polymer 1 of Preparation Example 1.

PREPARATION EXAMPLE 11

A photosensitive resin composition for a color filter protective layer is prepared according to the same method as Preparation Example 1, except for using no cross-linkable alkali soluble resin, that is, excluding the polymer 1 of Preparation Example 1.

Disposition of a Color Filter Protective Layer

EXAMPLES 1 to 10 and COMPARATIVE EXAMPLE 1

The photosensitive resin compositions for a color filter protective layer according to Preparation Examples 1 to 11 are respectively coated on an 8 inch wafer having a photodiode and a pad with a spin-coater (1H-DX2®, Mikasa Inc.) and then dried at 100° C. for 180 seconds, fabricating a coating layer.

The respective coating layers are radiated with light at a wavelength of 365 nm at a speed ranging from 100 to 1100 ms (step=100 ms), using an I-line stepper (NSR i10C®, Nikon Co.) having a reticle carved in various-sized patterns. Next, the coating layers are developed with an aqueous solution diluted with 0.19 wt % of tetramethyl ammonium hydroxide (TMAH) at 23° C. for 2 minutes and cleaned with pure water for one minute.

The respective wafers are heated for curing in a 200° C. oven for 180 seconds, finally disposing color filter protective layers according to Examples 1 to 10 and Comparative Example 1.

Property Evaluation 1: Close-Contacting Property Evaluation

The color filter protective layers according to Examples 1 to 10 and Comparative Example 1 are observed regarding pattern-lifting degrees with an optical microscope. The results are provided in the following Table 1.

<Evaluation Reference>

◎: no pattern lifting

○: a little pattern lifting around a bulk

X: severe pattern lifting

Property Evaluation 2: Pattern Profile Observation

The color filter protective layers according to Examples 1 to 10 and Comparative Example 1 are observed with a scanning electron microscope (SEM) to see if their pattern profile is a square or not. The results are provided in the following Table 1.

TABLE 1

| <Evaluation Reference> | | |
|---|---|---|
| | Close contacting property (adhesion to another layer) | Pattern profile |
| Example 1 | ○ | ○ |
| Example 2 | ○ | ○ |
| Example 3 | ◎ | ○ |
| Example 4 | ◎ | ◎ |
| Example 5 | ◎ | ◎ |
| Example 6 | ◎ | ◎ |
| Example 7 | ◎ | ◎ |
| Example 8 | ◎ | ◎ |
| Example 9 | ○ | ◎ |
| Example 10 | ○ | ◎ |
| Comparative Example 1 | X | X |

◎: good square shape

○: somewhat rounded shape

X: perfectly rounded shape

As shown in Table 1, the color filter protective layer prepared using the photosensitive resin composition for a color filter protective layer according to Examples 1 to 10 have an excellent close contacting (adhesive) property with a lower layer and excellent pattern profile, compared with the one of Comparative Example 1 including no cross-linkable alkali soluble resin at all.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter protective layer, comprising:

0.1 to 30 wt % of (A) an alkali soluble resin comprising a cross-linkable alkali soluble resin having a repeating unit represented by the following Chemical Formula 1 and an alkali soluble resin that is different from the cross-linkable alkali-soluble resin having a repeating unit represented by Chemical Formula 1, wherein the photosensitive resin composition comprises 0.1 to 5 wt % of the cross-linkable alkali soluble resin having a repeating unit represented by the following Chemical Formula 1;

0.1 to 30 wt % of (B) a reactive unsaturated compound;

0.05 to 10 wt % of (C) a photopolymerization initiator; and (D) a solvent in a balance amount:

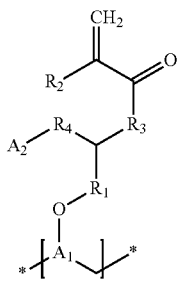

[Chemical Formula 1]

wherein, in Chemical Formula 1,
$A_1$ is a substituted or unsubstituted aromatic organic group or a substituted or unsubstituted alicyclic organic group,
$A_2$ is represented by the following Chemical Formulas 2 or 3,
$R_1$ and $R_3$ are independently substituted or unsubstituted alkylene,
$R_2$ is hydrogen or substituted or unsubstituted alkyl, and
$R_4$ is an oxygen atom or substituted or unsubstituted amine,

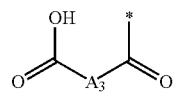

[Chemical Formula 2]

wherein, in Chemical Formula 2,
$A_3$ is a substituted or unsubstituted aromatic organic group or a substituted or unsubstituted alicyclic organic group, and

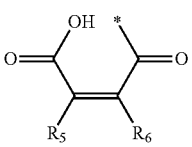

[Chemical Formula 3]

wherein, in Chemical Formula 3,
$R_5$ and $R_6$ are independently hydrogen, halogen, or substituted or unsubstituted alkyl.

2. The photosensitive resin composition of claim 1, wherein the cross-linkable alkali soluble resin having a repeating unit represented by the following Chemical Formula 1 (A) has a weight average molecular weight (MW) ranging from 1000 to 50,000.

3. The photosensitive resin composition of claim 1, further comprising (E) an additive comprising a silane coupling agent, a surfactant, or a combination thereof.

4. A color filter protective layer fabricated using the photosensitive resin composition according to claim 1.

5. An image sensor comprising a color filter protective layer of claim 4 as an overcoat or both an overcoat and a microlense.

6. The photosensitive resin composition of claim 1, wherein the photosensitive resin composition comprises 0.1 to 1.5 wt % of the cross-linkable alkali soluble resin having a repeating unit represented by Chemical Formula 1.

7. The photosensitive resin composition of claim 1, wherein the photosensitive resin composition comprises 0.1 to 25 wt % of the (A) alkali soluble resin.

8. The photosensitive resin composition of claim 7, wherein the photosensitive resin composition comprises 0.1 to 20 wt % of the (A) alkali soluble resin.

9. A photosensitive resin composition for a color filter protective layer, comprising:
0.1 to 15 wt % of (A) an alkali soluble resin comprising a cross-linkable alkali soluble resin having a repeating unit represented by the following Chemical Formula 1 and an alkali soluble resin that is different from the cross-linkable alkali-soluble resin having a repeating unit represented by Chemical Formula 1, wherein the photosensitive resin composition comprises 0.1 to 9 wt % of the cross-linkable alkali soluble resin having a repeating unit represented by the following Chemical Formula 1;
0.1 to 30 wt % of (B) a reactive unsaturated compound;
0.05 to 10 wt % of (C) a photopolymerization initiator; and
(D) a solvent in a balance amount:

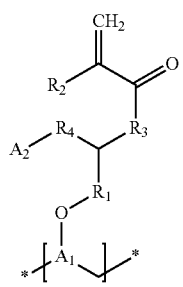

[Chemical Formula 1]

wherein, in Chemical Formula 1,
$A_1$ is a substituted or unsubstituted aromatic organic group or a substituted or unsubstituted alicyclic organic group,
$A_2$ is represented by the following Chemical Formulas 2 or 3,
$R_1$ and $R_3$ are independently substituted or unsubstituted alkylene,
$R_2$ is hydrogen or substituted or unsubstituted alkyl, and
$R_4$ is an oxygen atom or substituted or unsubstituted amine,

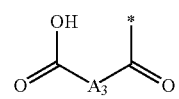

[Chemical Formula 2]

wherein, in Chemical Formula 2,
$A_3$ is a substituted or unsubstituted aromatic organic group or a substituted or unsubstituted alicyclic organic group, and

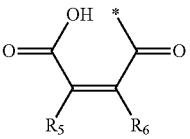

[Chemical Formula 3]

wherein, in Chemical Formula 3,
$R_5$ and $R_6$ are independently hydrogen, halogen, or substituted or unsubstituted alkyl.

* * * * *